United States Patent

Botti et al.

Patent Number: 5,621,357
Date of Patent: Apr. 15, 1997

[54] CLASS AB OUTPUT AMPLIFIER STAGE

[75] Inventors: Edoardo Botti, Pavia; Giorgio Chiozzi, Palestro, both of Italy

[73] Assignee: SGS-Thomson Microelectronics S.r.l., Agrate Brianza, Italy

[21] Appl. No.: 448,259

[22] Filed: May 23, 1995

[30] Foreign Application Priority Data

May 23, 1994 [EP] European Pat. Off. .............. 94830239

[51] Int. Cl.⁶ .............................. H23F 3/45; H03F 3/30
[52] U.S. Cl. ......................... 330/253; 330/255; 330/260; 330/264; 330/267
[58] Field of Search ................................. 330/253, 255, 330/260, 264, 267

[56]  References Cited

U.S. PATENT DOCUMENTS

| | | | |
|---|---|---|---|
| 4,152,663 | 5/1979 | Van de Sande | 330/255 X |
| 4,866,398 | 9/1989 | Gulczynski | 330/263 |
| 4,888,559 | 12/1989 | Sevenhans et al. | 330/255 X |
| 4,963,837 | 10/1990 | Dedic | 330/255 X |
| 4,970,470 | 11/1990 | Gosser | 330/255 X |
| 5,039,953 | 8/1991 | Su | 330/264 |
| 5,166,635 | 11/1992 | Shih | 330/260 X |
| 5,172,073 | 12/1992 | Fujii | 330/255 |
| 5,266,887 | 11/1993 | Smith | 330/255 X |
| 5,399,991 | 3/1995 | Moraveji | 330/255 |

FOREIGN PATENT DOCUMENTS

| | | | |
|---|---|---|---|
| 0535951 | 4/1993 | European Pat. Off. | H03F 3/30 |
| 62-230206 | 10/1987 | Japan | H03F 3/30 |

*Primary Examiner*—James B. Mullins
*Attorney, Agent, or Firm*—David V. Carlson; Harry K. Ahn; Seed and Berry LLP

[57]  ABSTRACT

An AB class stage is described which comprises two complementary MOSFET final transistors connected in a push-pull manner between two supply terminals. In order to attain high linearity, low switching distortion, a high ratio between the maximum output current and the rest current, independence of the rest current from the temperature and manufacturing variables and a circuit simplicity, the circuits determining the rest current and those which provide current to the load are substantially independent of one another. More particularly, two transconductance amplifiers are provided which control the final transistors and are dimensioned so as to have zero output current in rest conditions, two voltage generators which determine the rest current and two resistors being connected between the gate electrodes of the final transistors and the supply terminals.

26 Claims, 3 Drawing Sheets

CLASS AB OUTPUT AMPLIFIER STAGE

TECHNICAL FIELD

The present invention relates to linear amplifiers and, more particularly, to a class AB output amplifier stage which uses final power components with complementary field effect transistors (MOSFET).

BACKGROUND OF THE INVENTION

In the planning of the class AB output stages, such as those used in operational power amplifiers, it is sought to attain the following characteristics:

high linearity, that is, low harmonic distortion;

low distortion owing to the switching between one final power component and the other;

high ratio between maximum output current and rest current;

substantial independence of the rest current from the temperature and from variations in the manufacturing parameters if it is produced in an integrated circuit; and circuit simplicity.

Various class AB output amplifier stages with complementary MOSFET transistors are known which permit one or some of the above characteristics to be attained, but none of them is able to obtain all of them, as would be desirable.

SUMMARY OF THE INVENTION

The object of the present invention is to propose an output amplifier stage of the type indicated above which has all of these characteristics.

In one aspect of the invention, a circuit has a circuit input terminal and drives a load coupled to a circuit output terminal. The circuit includes an output stage that has first and second transistors each having a drive terminal, which is coupled to the circuit output terminal, and a control terminal. A first transconductance amplifier has a first amplifier input terminal coupled to the circuit input terminal and an amplifier output terminal coupled to the control terminal of the first transistor. A second transconductance amplifier has a first amplifier input terminal coupled to the circuit input terminal and an amplifier output terminal coupled to the control terminal of the second transistor. A bias circuit is coupled to the control terminals of the first and second transistors and is operable to maintain a predetermined current flow through the transistors and a substantially zero current flow through the load during a quiescent interval.

BRIEF DESCRIPTION OF THE DRAWINGS

The invention and the advantages derived therefrom will become clearer from the following description of some of its embodiments given purely by way of non-limiting example with reference to the appended drawings in which.

DETAILED DESCRIPTION OF THE INVENTION

Figure 1:
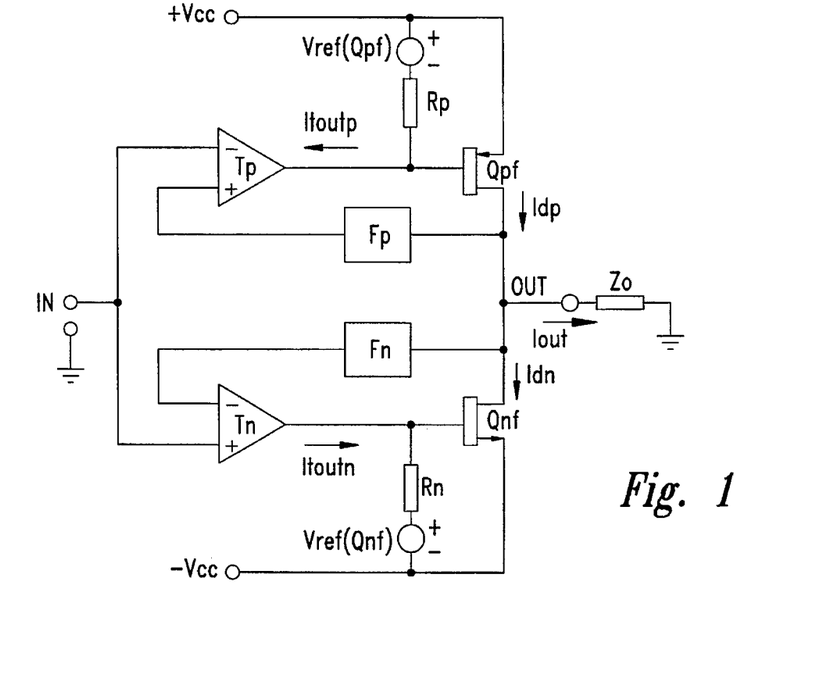
FIG. 1 is a basic circuit diagram, partially in block form, of a class AB output stage according to the invention.

In FIG. 1, two power MOSFET transistors, that is, MOS-type field effect transistors, are indicated Qpf and Qnf. They are complementary to one another, more precisely, the first is a p-channel transistor and the second is an n-channel transistor, and are connected in a push-pull manner as final components of an AB class output amplifier stage. The drain electrodes of the two transistors are connected to one another and constitute the output terminal, indicated OUT, of the stage and the source electrodes are connected to a first, positive terminal indicated +Vcc and to a second, negative terminal indicated −Vcc of a voltage supply, respectively. The output terminal OUT is connected by means of a load Zo to a reference terminal, represented by the ground symbol, which is at an intermediate potential relative to the potentials of the terminals +Vcc and −Vcc.

Two differential-type transconductance amplifiers, designated Tp and Tn, have their respective output terminals connected to the gate electrodes of the transistors Qpf and Qnf respectively, their respective inverting (−) input terminals connected to one another so as to form the input terminal, designated IN, of the stage, and their respective non-inverting input terminals (+) each connected to the output terminal OUT by means of respective feedback networks, indicated Fp and Fn respectively.

Two voltage generators, indicated Vref(Qpf) and Vref(Qnf) are each connected by means of a respective resistor Rp and Rn between the gate electrodes of the transistors Qpf and Qnf and the supply terminals +Vcc and −Vcc respectively. Together the voltage-generator/resistor pairs form biasing circuits that properly bias Qpf and Qnf respectively, particularly during a rest condition (the voltage at IN substantially equal to zero) as described below.

The transconductance amplifiers Tp and Tn and the feedback networks Fp and Fn are dimensioned such that the output current of the transconductance amplifiers is substantially zero in rest conditions, that is, with the respective inverting and noninverting inputs at the same voltage. The voltage generators Vref(Qpf) and Vref(Qnf) are dimensioned such that, in the same rest conditions, the voltages between the gate and source electrodes of the transistors, Qpf and Qnp respectively, are such that they cause current of a predetermined value, substantially equals for both transistors, which is the rest current of the stage, to pass. In these conditions, no current is supplied to the load Zo and no current passes through the resistors Rp and Rn.

Any change in these conditions, by virtue, for example, of the application of a signal between the input terminal IN and ground, causes imbalances in both amplifiers Tp and Tn and, therefore, causes the passage of currents Itoutp and Itoutn of opposite signs in the respective output terminals of both amplifiers and through the resistors connected thereto, Rp and Rn respectively. The voltage drops at the resistors Rp and Rn in turn cause variations of an opposite sign in the voltages Vgs between the gate and source of the final transistors, Qpf and Qnf respectively. Consequently, there are corresponding variations in the conduction of the two transistors and thus variations of opposite signs in the respective drain currents Idp and Idn and the passage of an output current Iout through the load Zo which is equal to the difference between the drain currents of the two transistors.

When dimensioning the circuit, it should be borne in mind that, if Vgsmax(Qpf) and Vgsmax(Qnf) are the voltages between the source and gate of the two transistors enabling the maximum drain currents to be obtained, Itmax(Tp) and Itmax(Tn) are the maximum output currents of the two transconductance amplifiers, Rp and Rn represent the resistances of the resistors shown with the same reference symbol, and Vref (Qpf) and Vref (Qnf) represent the voltages of the voltage generators indicated by the same reference symbol, the following conditions should be respected:

$$Itmax(Tp).Rp+Vref(Qpf) \geq Vgsmax(Qpf) \text{ and}$$

$$Itmax(Tn).Rn+Vref(Qnf) \geq Vgsmax(Qnf).$$

Furthermore, the amplifiers Tp and Tn should have transconductance values Gmp, Gmn such that the system is stable for a given feedback system and for given characteristics of the final transistors Qpf and Qnf and of the load Zo.

In one aspect of the invention, the stage is produced symmetrically, that is, with its parts and its components marked "p" equal and complementary to the parts and components marked "n."

Figure 6:
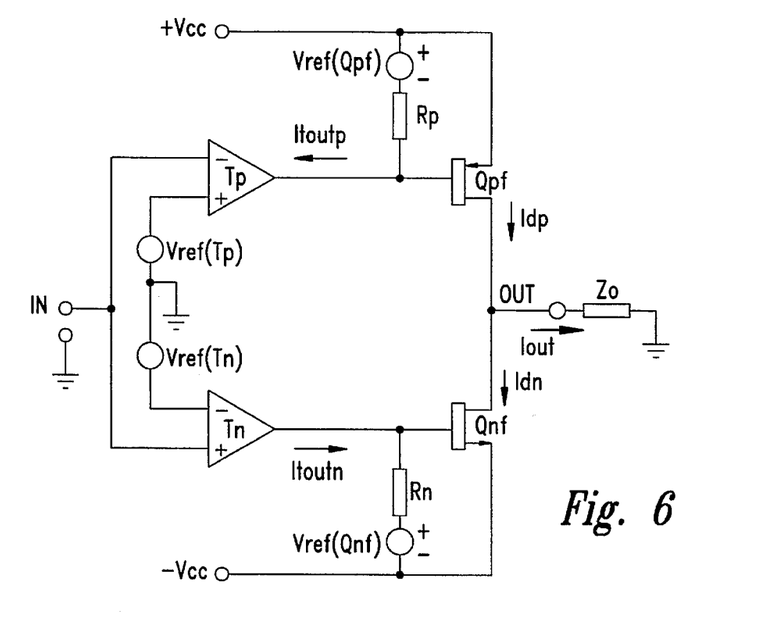

It should be noted that the feedback networks Fp and Fn, which are used for determining the gain of the stage and for rendering the circuit more stable and more linear, could in some applications be omitted and in their place suitable reference voltage generators could be used for application to the non-inverting terminals of the amplifiers Tp and Tn as shown in FIG. 6 which is identical to FIG. 1 except the replacement of feedback networks Fp and Fn with reference voltage generators Vref(Tp) and Vrf(Tn). Furthermore, instead of two different feedback systems, a single system could be provided which is common to the two transconductance amplifiers.

Figure 2:
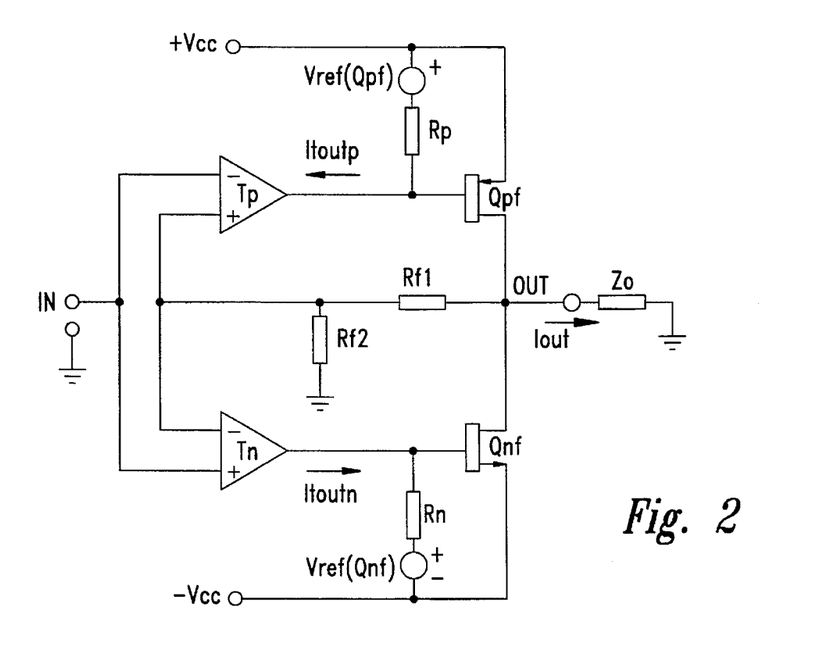
FIG. 2 is a basic circuit diagram showing a variant of the diagram of FIG. 1.

An example of a common feedback network according to another embodiment of the invention is shown in FIG. 2 where, as a single variant relative to FIG. 1, the non-inverting terminals of the amplifiers Tp and Tn are connected to one another and to the intermediate node of a voltage divider, formed by two resistors, indicated Rf1 and Rf2, connected between the output terminal OUT and ground. The ratio between the resistances of the two resistors determines the gain of the stage. In all other structural and operational aspects, the circuit of FIG. 2 is similar to that of FIG. 1.

Figure 3:
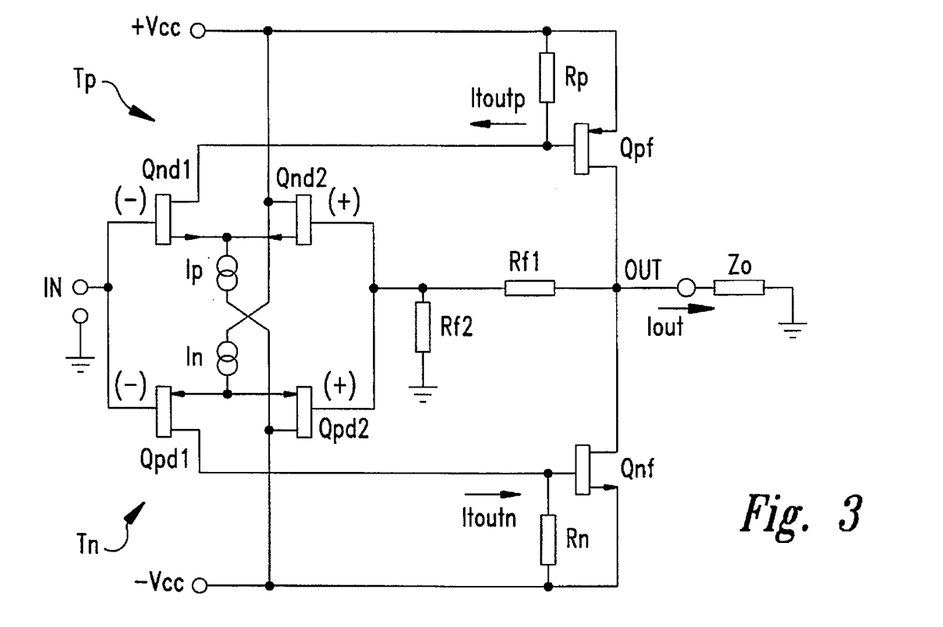
FIGS. 3, 4, 5 and 6 are circuit diagrams of four embodiments of the output stage in class AB according to the invention.

In the embodiment shown in FIG. 3, in which the same reference numerals as used in FIG. 2 indicate identical or equivalent elements, the first transconductance amplifier Tp, that is, the one which controls the final p-channel transistor, Qpf, is a differential circuit formed by a pair of n-channel MOSFET transistors arranged with common sources, indicated Qnd1 and Qnd2 and by a first constant current generator Ip connected between the common source electrodes and the supply terminal −Vcc. The drain electrode of the transistor Qnd2 is connected to the supply terminal +Vcc and that of the transistor Qnd1 is the output terminal of the first transconductance amplifier and is therefore connected to the gate electrode of the final transistor Qpf. In a symmetrical manner, the second transconductance amplifier Tn, which is the one controlling the final n-channel transistor, Qnf, is formed by a pair of p-channel MOSFET transistors arranged with common sources, indicated Qpd1 and Qpd2, and by a second constant current generator In connected between the common source electrodes and the supply terminal +Vcc. The drain electrode of the transistor Qpd2 is connected to the supply terminal −Vcc and that of the transistor Qpd1 is the output terminal of the second transconductance amplifier and is therefore connected to the gate electrode of the final transistor Qnf.

The gate electrodes of the transistors Qnd2 and Qpd2 are the non-inverting terminals of the two transconductance amplifiers and are therefore both connected to the feedback system Rf1, Rf2 and the gate electrodes of the transistors Qnd1 and Qpd1 are the inverting terminals of the same amplifiers and are connected to the input terminal IN of the stage.

In this example, the reference voltage generators for determining the rest current of the stage consist, respectively, of the resistor Rp and of the series connection of the transistors Qnd1 and of the constant current generator Ip, as regards the polarization of the final transistor Qpf, and of the resistor Rn and the series connection of the transistor Qpd1 and of the constant current generator In, as regards the polarization of the final transistor Qnf. The transconductance amplifiers and the reference voltage generators have components in common such that, for clarity, they are not shown separately as they are, for example, in FIG. 2. The currents Ip and In of the two constant current generators, indicated by the same reference of the respective generators, should satisfy the following conditions:

$$Ip=N.Vref(Qpf)/Rp \text{ and}$$

$$In=N.Vref(Qnf)/Rn$$

in which N is a number which depends on the dimensional ratio between the transistors of the two differential pairs, and Vref (Qpf) and Vref (Qnf) are the voltages which are to be applied between the gate and source of the final transistors Qpf and Qnf in order to attain the rest current. The dimensional ratio between the transistors, and therefore the number N, is determined by taking account of the maximum gate-source voltage Vgsmax of the final transistors, that is, that which corresponds to the maximum drain current. When considering the upper section of the circuit, if Vgsmax (Qpf)≦2 Vref(Qpf), the transistors Qnd1 and Qnd2 can have equal areas: in fact, in these conditions, at rest, the current Ip is divided into equal parts between Qnd1 and Qnd2, such that Vref(Qpf)=½ Ip . Rp whilst, with the differential amplifier completely unbalanced, the voltage drop at Rp is Vgsmax=Ip.Rp.

Figure 4:
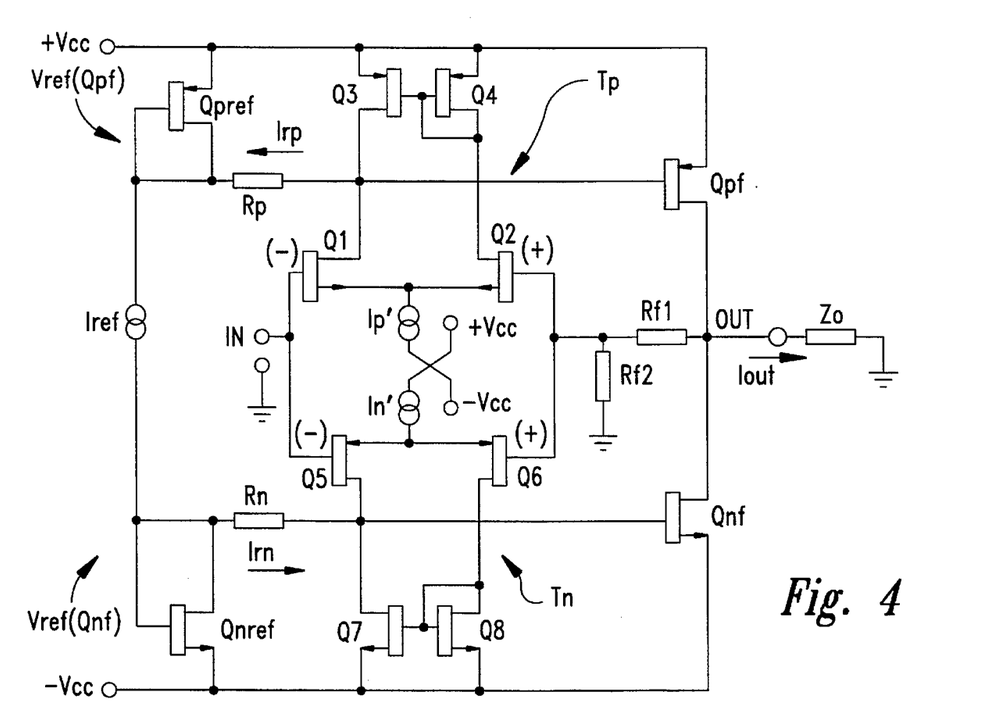

If, on the other hand, Vgsmax(Qpf)≧2Vref(Qpf), the area of Qnd1 should be correspondingly smaller than that of Qnd2. For example, if Vref(Qpf)/Rp=11. Vgsmax(Qpf)/Rp, the area of the transistor Qnd1 should be one tenth of that of Qnd2 and Ip=11. Vref (Qpf)/Rp. Similar considerations apply for the lower section of the circuit. In the embodiment of FIG. 4, the reference voltage generators Vref (Qpf) and Vref (Qnf) are formed by two MOSFET transistors, one, indicated Qpref, being p-channel and the other, indicated Qnref, being n-channel, with the respective gate and drain electrodes connected together at the two terminals of a constant current generator, indicated Iref, and the respective source electrodes connected respectively to the positive terminal +Vcc and to the negative terminal −Vcc of the voltage supply. The transconductance amplifiers Tp and Tn are differential amplifiers each comprising a pair of MOSFET transistors arranged with common sources. The amplifier Tp comprises two n-channel transistors Q1 and Q2, with the source electrodes connected to the terminal −Vcc by means of a constant current generator Ip and two p-channel transistors, Q3 and Q4, connected as load elements between the drain electrodes of Q1 and Q2 and the terminal +Vcc and forming a current mirror circuit. As the output terminal of the amplifier Tp, the drain electrode of Q1 is connected to the gate electrode of the transistor Qpf and to a terminal of the resistor Rp. The amplifier Tn is formed in an entirely similar but complementary manner to the amplifier Tp and comprises common source p-channel transistors Q5, Q6, a constant current generator In and current mirror load n-channel transistors, Q7 and Q8. The operation of the circuit of FIG. 4 is evident from its circuit as shown and described herein.

Figure 5:
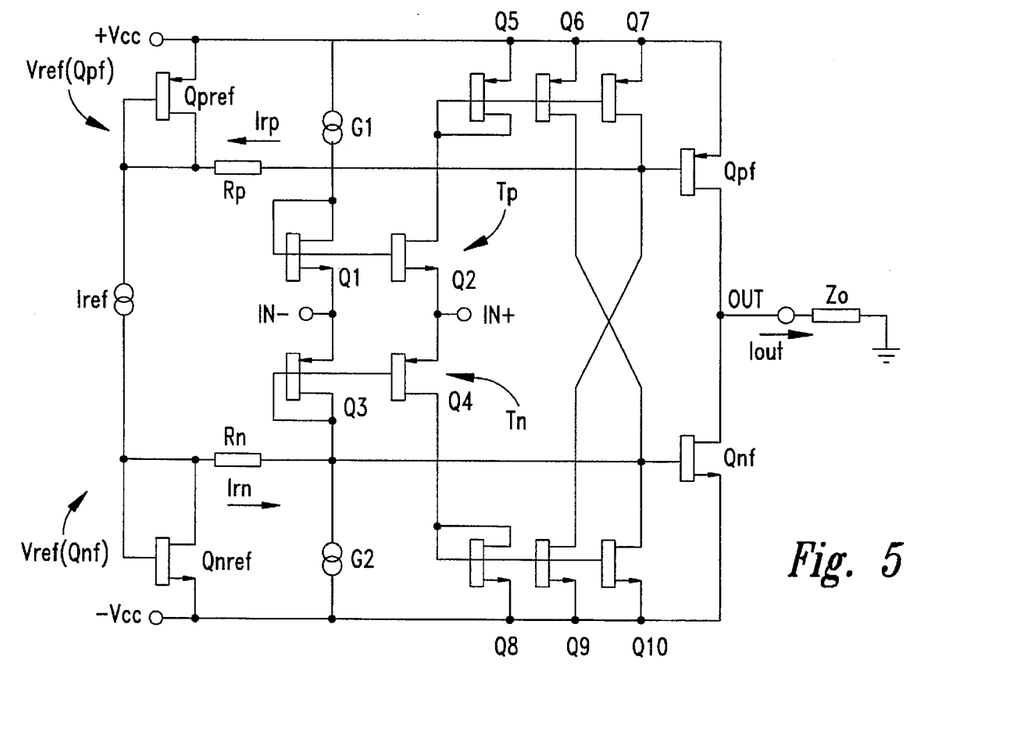

In the embodiment of FIG. 5, the reference voltage generators Vref(Qpf) and Vref(Qnf) are similar to those described in relation to FIG. 4, however, the transconductance amplifiers Tp and Tn are separate and connected to one another. More particularly, the two transconductance amplifiers are formed of a circuit structure of a differential type in which the components, for clarity, are not considered as belonging exclusively to one or other amplifier. The FIG. 5 circuit, however, is consistent with FIGS. 1 and 2 but lacks the feedback network. The differential structure comprises a first circuit branch comprising two MOSFET transistors Q1 and Q3, the first being n-channel and the second being p-channel, connected by their gate electrodes to the respective drain electrodes, with the source electrodes joined together so as to form an inverting input terminal IN− of the differential circuit and with the drain electrodes connected to the positive terminal +Vcc and to the negative terminal −Vcc of the supply respectively by means of respective constant current generators G1 and G2. The differential structure also comprises a second circuit branch with two MOSFET transistors Q2 and Q4, the first being n-channel and the second being p-channel, with their source electrodes connected together so as to form a non-inverting input terminal IN+ of the differential circuit, their gate electrodes connected to the gate electrodes of the transistors Q1 and Q3 respectively, and their drain electrodes connected respectively to the positive supply terminal +Vcc through a p-channel MOSFET transistor Q5 having the gate electrode connected to the drain electrode and to the negative supply terminal −Vcc via the n-channel. MOSFET transistor Q8, connected as the transistor Q5. Two p-channel transistors, Q6 and Q7, and two n-channel transistors, Q9 and Q10, are connected to the transistors Q5 and Q8, respectively, in a current mirror configuration. The drain electrode of the transistor Q6 is connected to the gate electrode of the final n-channel transistor Qnf and the drain electrode of the transistor Q7 is connected to the gate electrode of the final p-channel transistor Qpf. Similarly, the drain electrodes of the transistors Q9 and Q10 are connected to the gate electrodes of Qpf and Qnf respectively. The input terminals of the differential structure, if necessary, are connected to suitable polarization means, not shown. It should be noted that, in this embodiment, the input signal is applied between the two input terminals IN− and IN+ and that no feedback system is provided between the input and the output of the stage.

The operation of the circuit of FIG. 5 will now be considered. At rest, that is, when there is no signal between the input terminals IN− and IN+, a current determined by the two current generators G1 and G2 passes through the transistors Q1 and Q3. The same current which passes through Q1 and Q3 also passes through the transistors Q2 and Q4 if they are dimensionally equal to the respective transistors Q1 and Q3. This same current passes both through the transistor Q5, and is reflected in the transistors Q6 and Q7, and the transistor Q8, and is reflected in 14 the transistors Q9 and Q10. Since the current passing in Q6 is equal to the current passing in Q10, no current passes through the resistor Rn and the voltage at the gate electrode Qnf is the reference voltage determined by the reference voltage generator Vref(Qnf), formed by the transistor Qnref and by the constant current generator Iref. Similarly, since the current passing in Q9 is equal to the current passing in Q7, no current passes through the resistor Rp and the voltage at the gate electrode of Qpf is the reference voltage determined by the reference voltage generator Vref(Qpf), formed by the transistor Qpref and by the constant current generator Iref. Therefore, the same current, that is, the rest current, passes through the final transistors Qpf and Qnf, and no current passes through the load Zo.

An imbalance of the differential circuit owing to the application of a signal between the two input terminals IN− and IN+, will now be considered, for example in the case in which the potential at the input terminal IN+ is greater than that at the input terminal IN−. This imbalance causes an increase in the current in Q4 and a reduction of the current in Q2 and, therefore, an increase in the currents in Q8, Q9 and Q10 and a reduction of the currents in Q5, Q6 and Q7. Owing to the different currents in Q6 and in Q10 and of the different currents in Q9 and Q7, respective different currents will pass in the resistors Rn and Rp, such that the voltage between the gate and source electrodes of the transistor Qpf, Vgs(Qpf), increases relative to the reference voltage Vref (Qpf) and that of Qnf decreases relative to the reference voltage Vref (Qnf). Therefore, the currents passing through the two final transistors are also different, such that a current, which is the difference between the currents of the two final transistors, passes through the load Zo.

From a practical analysis of the different embodiments described above, it is noted that the output amplifier stage according to the invention has high linearity and low distortion when switching between one final transistor and the other since there is no discontinuity in the command of the final transistors and since the circuits determining the rest current and the circuits supplying the required current to the load function substantially independently of one another. This further enables a high ratio to be obtained between the maximum output current and the rest current, since the rest current can be set with great precision at very low values and the dynamics of the final components are not limited at all by the control circuit. The dependence on the temperature and on the variations in the parameters of the process can also be limited to a great extent by virtue of the possibility of compensation deriving from the total symmetry of the control circuits of the two complementary final components. Finally, the simplicity of the circuit is evident and therefore the stage according to the invention lends itself to production in integrated circuits with very restricted areas.

Although only some embodiments of the invention have been illustrated and described, it is evident that numerous variations and modifications are possible within the spirit and scope of the same inventive concept. For example, the transconductance amplifiers could be produced with bipolar transistors instead of with MOSFET transistors and the resistors Rp and Rn could be resistive means having substantially the structure of MOSFET transistors with the drain and gate electrodes short-circuited; furthermore, two power components each comprising more than one transistor could be provided in the place of the MOSFET power transistors Qpf and Qnf.

We claim:

1. A class AB output amplifier stage comprising a first and a second field effect transistor power component which are complementary to one another, each having a first and a second power electrode and a control electrode, and being connected, in push-pull manner relative to one another, by the respective first power electrodes to a first and to a second terminal of a voltage supply respectively, and the second power electrodes connected to one another and to an output terminal of the stage, characterised in that it comprises:

a first and a second transconductance amplifier each having an output terminal connected to the control electrode of the first and of the second power component respectively and an input terminal connected to the input terminal of the other transconductance amplifier, so as to form an input terminal of the stage, and being dimensioned so as to have an output current which is substantially zero in rest conditions;

a first and a second voltage generator connected to the control electrode of the first and of the second power component respectively, the voltages of these generators being selected so as to determine currents which are substantially equal through the first and second power components in rest conditions of the stage; and a first and a second resistive means connected between the control electrode of the first and of the second power component respectively and the first and the second terminal of the voltage supply respectively.

2. A stage according to claim 1, in which each of the transconductance amplifiers comprises an inverting input terminal which is the above input terminal connected to the input terminal of the stage and a non-inverting input terminal, and in which the non-inverting input terminal of each of the transconductance amplifiers is connected to a respective reference voltage generator.

3. A stage according to claim 1, in which the input terminals of the first and second transconductance amplifiers are inverting input terminals and the stage further includes first and second reference voltage generators respectively connected to non-inverting input terminals of the first and second transconductance amplifiers wherein the first and second reference voltage generators consist of respective feedback networks connected to the output terminal of the stage.

4. A stage according to claim 1, in which the input terminals of the first and second transconductance amplifiers are inverting input terminals and the stage further includes first and second reference voltage generators respectively connected to non-inverting input terminals of the first and second transconductance amplifiers wherein the first and second reference voltage generators consist of a common feedback network connected to the output terminal of the stage.

5. A stage according to claim 4, in which a reference terminal is provided which is common to the input and to the output of the stage, and in which:

the first and the second power components consist of a first and of a second field effect power transistor being p-channel and n-channel respectively, the first and the second power electrode being the source and drain electrodes respectively and the control electrode being the gate electrode;

the first transconductance amplifier comprises a first pair of n-channel field effect transistors in common source arrangement and a first current generator connected between the common source electrodes and the second supply voltage terminal, the drain of one of the transistors of the first pair being connected to the first supply terminal and the drain of the other transistor of the first pair being the output terminal of the first transconductance amplifier;

the second transconductance amplifier comprises a second pair of p-channel field effect transistors in the common source arrangement and a second current generator connected between the common source electrodes and the first supply terminal, the drain of one of the transistors of the second pair being connected to the second supply terminal and the drain of the other of the transistors of the second pair being the output terminal of the second transconductance amplifier, the gate electrodes of the transistors of the first and of the second pair being connected to one another in pairs, so as to form the above inverting terminal, which is the input terminal of the stage, and the said non-inverting terminal;

the first resistive means is a first resistor connected directly between the gate electrode of the first power transistor and the first supply terminal and the first current generator constitutes, together with the first resistor, the first reference voltage generator;

the second resistive means is a second resistor directly connected between the gate electrode of the second power transistor and the second supply terminal and the second current generator constitutes, together with the second resistor, the second reference voltage generator; and the feedback network comprises a voltage divider connected between the output terminal of the stage and the common reference terminal and having the intermediate node connected to the common gate electrodes of the transistors of the two transconductance amplifiers which constitute the non-inverting terminal.

6. A stage according to claim 4, in which:

the first resistive means is a first resistor connected to the first supply terminal via a first p-channel field effect reference transistor having common drain and gate electrodes and the second resistive means is a second resistor connected to the second supply terminal via a second n-channel field effect reference transistor having common drain and gate electrodes, a reference current generator being connected between the common gate and drain electrodes of the first reference transistor and the common gate and drain electrodes of the second reference transistor, so as to form the first and the second voltage generators together with the first and second reference transistors.

7. A stage according to claim 6, in which the first and the second transconductance amplifiers comprise a first and a second differential amplifier.

8. A stage according to claim 7, in which:

the first differential amplifier comprises a first pair of n-channel field effect transistors in the common source configuration, a constant current generator connected between the common source electrodes and the second supply terminal and a second pair of p-channel field effect transistors connected as load elements between the drain electrodes of the transistors of the first pair and the first supply terminal and connected between each other in the current mirror configuration; and the second differential amplifier comprises a third pair of p-channel field effect transistors in the common source configuration, a constant current generator connected between the common source electrodes and the first supply terminal and a fourth pair of n-channel field effect transistors connected as load elements between the drain electrodes of the transistors of the third pair and the second supply terminal and connected to one another in the current mirror configuration.

9. A stage according to claim 1, in which the first resistive means is a first resistor connected to the first supply terminal via a first p-channel field effect transistor having common drain and gate electrodes and the second resistive means is a second resistor connected to the second supply terminal via a second n-channel field effect reference transistor having common drain and gate electrodes, a reference current generator being connected between the common drain and gate electrodes of the first reference transistor and the common drain and gate electrodes of the second reference transistor, so as to form the first and second voltage generators together with the first and second reference transistors.

10. A stage according to claim 9, in which the first and the second transconductance amplifiers are formed in a differential structure comprising:

a first circuit branch inserted between the first and the second supply terminals and comprising, in series relative to each other, a first constant current generator with a terminal connected to the first supply terminal, a first n-channel field effect transistor with the drain electrode connected to the gate electrode, a second p-channel field effect transistor with the drain electrode connected to the gate electrode, and a second constant current generator with a terminal connected to the second supply terminal, the source electrodes of the first and second transistors being connected to one another so as to form the inverting input terminal of the differential structure which constitutes the said input terminal of the stage;

a second circuit branch comprising a third and a fourth field effect transistors, the first being n-channel and the second being p-channel, with their source electrodes connected together so as to form a non-inverting input terminal of the differential structure which constitutes a further input terminal of the stage, with the respective gate electrodes connected to the gate electrodes of the first and of the second field effect transistors of the first branch respectively and with the respective drain electrodes connected to the common drain and source electrodes of a fifth and a sixth field effect transistor, respectively, p-channel and n-channel having respective source terminals connected to the first and to the second supply terminal respectively;

a first pair of p-channel field effect transistors having the gate electrodes connected to the gate electrodes of the fifth field effect transistor, the source electrodes connected to the first supply terminal and the drain electrodes connected one to the control electrode of the second power component and the other to the control electrode of the first power component; and a second pair of n-channel field effect transistors having the gate electrodes connected to the gate electrode of the sixth field effect transistor, the source electrodes connected to the second supply terminal and the drain electrodes connected one to the control electrode of the first power component and the other to the control electrode of the second power component.

11. A circuit having a circuit input terminal and for driving a load coupled to a circuit output terminal, comprising:

an output stage including first and second field effect transistors each having a drive terminal, which is coupled to said circuit output terminal, and a control terminal;

a first transconductance amplifier having a first amplifier input terminal coupled to said circuit input terminal and an amplifier output terminal coupled to said control terminal of said first transistor;

a second transconductance amplifier having a first amplifier input terminal coupled to said circuit input terminal and an amplifier output terminal coupled to said control terminal of said second transistor; and a bias circuit including first and second bias resistors respectively coupled to said control terminals of said first and second transistors and operable to maintain a predetermined current flow through said transistors and a substantially zero current flow through said load during a quiescent interval.

12. The circuit of claim 11 wherein:

said first transistor is a p-channel transistor; and said second transistor is an n-channel transistor.

13. The circuit of claim 11 wherein said first and second transconductance amplifiers each comprise a second amplifier input terminal coupled to said circuit output terminal.

14. The circuit of claim 13 further comprising a feedback network coupled between said second amplifier input terminals and said circuit output terminal.

15. The circuit of claim 11 wherein each of said transconductance amplifiers comprises:

a second amplifier input terminal coupled to said circuit output terminal;

a current source;

a third transistor having a first drive terminal coupled to said current source, a second drive terminal coupled to said amplifier output terminal, and a control terminal coupled to said first amplifier input terminal; and a fourth transistor having a first drive terminal coupled to said current source, and a control terminal coupled to said second amplifier input terminal.

16. The circuit of claim 15 wherein said bias circuit further includes:

a first voltage generator coupled to said first bias resistor; and a second voltage generator coupled to said second bias resistor.

17. The circuit of claim 15 further comprising a feedback network coupled between said second amplifier input terminals and said circuit output terminal.

18. The circuit of claim 11 wherein each of said transconductance amplifiers comprises:

a second amplifier input terminal coupled to said circuit output terminal;

a first current source;

a load element having first and second load-element terminals;

a third transistor having a first drive terminal coupled to said first current source, a second drive terminal coupled to said amplifier output terminal, and a control terminal coupled to said first amplifier input terminal; and a fourth transistor having a first drive terminal coupled to said first current source, a second drive terminal coupled to a respective one of said load-element terminals, and a control terminal coupled to said second amplifier input terminal.

19. The circuit of claim 18 wherein said bias circuit further includes:

a second current source;

a first reference voltage generator coupled to said second current source and said first bias resistor; and a second reference voltage generator coupled to said second current source and said second bias resistor.

20. The circuit of claim 18 further comprising a feedback network coupled between said second amplifier input terminal and said circuit output terminal.

21. A circuit having circuit input and output terminals, said circuit for driving a load coupled to said circuit output terminal, comprising:

an output stage including first and second field effect transistors each having a drive terminal, which is coupled to said circuit output terminal, and a control terminal;

an input stage having first and second input-stage input terminals coupled to said circuit input terminals and first and second input-stage output terminals;

an intermediate stage having first and second intermediate-stage input terminals respectively coupled to said first and second input-stage output terminals, and first and second intermediate-stage output terminals respectively coupled to said control terminals of said first and second transistors; and a bias circuit including first and second bias resistors respectively coupled to said control terminals of said first and second transistors and operable to maintain a predetermined current flow through said transistors and a substantially zero current flow through said load during a quiescent interval.

22. The circuit of claim 21 wherein said input stage comprises:

first and second current sources;

a third diode-coupled transistor coupled between said first current source and said first input-stage input terminal;

a fourth diode-coupled transistor coupled between said second current source and said first input-stage input terminal;

a fifth transistor having a control terminal coupled to said first current source, a first drive terminal coupled to said first input-stage output terminal, and a second drive terminal coupled to said second input-stage input terminal; and a sixth transistor having a control terminal coupled to said second current source, a first drive terminal coupled to said second input-stage output terminal, and a second drive terminal coupled to said second input-stage input terminal.

23. The circuit of claim 21 wherein said intermediate stage comprises:

a third diode-coupled transistor coupled to said first intermediate-stage input terminal;

a fourth diode-coupled transistor coupled to said second intermediate-stage input terminal;

a fifth transistor having a control gate coupled to said first intermediate-stage input terminal, and a drive terminal coupled to said second intermediate-stage output terminal;

a sixth transistor having a control gate coupled to said first intermediate-stage input terminal, and a drive terminal coupled to said first intermediate-stage output terminal;

a seventh transistor having a control gate coupled to said second intermediate-stage input terminal, and a drive terminal coupled to said first intermediate-stage output terminal; and an eighth transistor having a control gate coupled to said second intermediate-stage input terminal, and a drive terminal coupled to said second intermediate-stage output terminal.

24. The circuit of claim 21 wherein said bias circuit further includes:

a current source;

a first reference voltage generator coupled to said current source and said first bias resistor; and a second reference voltage generator coupled to said current source and said second bias resistor.

25. A circuit having a circuit input terminal and for driving a load coupled to a circuit output terminal, comprising:

an output stage including first and second transistors each having a drive terminal, which is coupled to said circuit output terminal, and a control terminal;

a first transconductance amplifier having a first amplifier input terminal coupled to said circuit input terminal and an amplifier output terminal coupled to said control terminal of said first transistor;

a second transconductance amplifier having a first amplifier input terminal coupled to said circuit input terminal and an amplifier output terminal coupled to said control terminal of said second transistor;

a bias circuit coupled to said control terminals of said first and second transistors and operable to maintain a predetermined current flow through said transistors and a substantially zero current flow through said load during a quiescent interval;

wherein each of said transconductance amplifiers includes:

a second amplifier input terminal coupled to said circuit output terminal;

a first current source;

a load element having first and second load-element terminals;

a third transistor having a first drive terminal coupled to said first current source, a second drive terminal coupled to said amplifier output terminal, and a control terminal coupled to said first amplifier input terminal; and a fourth transistor having a first drive terminal coupled to said first current source, a second drive terminal coupled to a respective one of said load-element terminals, and a control terminal coupled to said second amplifier input terminal; and wherein said bias circuit includes:

a second current source;

first and second reference generators respectively coupled to said second current source;

a first resistor coupled between said first reference generator and said control terminal of said first transistor; and a second resistor coupled between said second reference generator and said control terminal of said second transistor.

26. A circuit having circuit input and output terminals, said circuit for driving a load coupled to said circuit output terminal, comprising:

an output stage including first and second transistors each having a drive terminal, which is coupled to said circuit output terminal, and a control terminal;

an input stage having first and second input-stage input terminals coupled to said circuit input terminals and first and second input-stage output terminals;

an intermediate stage having first and second intermediate-stage input terminals respectively coupled to said first and second input-stage output terminals, and first and second intermediate-stage output terminals respectively coupled to said control terminals of said first and second transistors;

a bias circuit coupled to said control terminals and operable to maintain a predetermined current flow through said transistors and a substantially zero current flow through said load during a quiescent interval; and wherein said bias circuit includes:

a current source;

first and second reference generators respectively coupled to said current source;

a first resistor coupled between said first reference generator and said control terminal of said first transistor; and a second resistor coupled between said second reference generator and said control terminal of said second transistor.

* * * * *